(12) United States Patent
Wimpenny

(10) Patent No.: US 9,628,025 B2
(45) Date of Patent: Apr. 18, 2017

(54) RESONANCE SUPPRESSION FOR ENVELOPE TRACKING MODULATOR

(71) Applicant: SNAPTRACK, INC., San Diego, CA (US)

(72) Inventor: Gerard Wimpenny, Cambridgeshire (GB)

(73) Assignee: SnapTrack, Inc., San Diego, CA (US)

( * ) Notice: Subject to any disclaimer, the term of this patent is extended or adjusted under 35 U.S.C. 154(b) by 0 days.

(21) Appl. No.: 14/765,246

(22) PCT Filed: Jan. 31, 2014

(86) PCT No.: PCT/EP2014/051960
§ 371 (c)(1),
(2) Date: Jul. 31, 2015

(87) PCT Pub. No.: WO2014/118341
PCT Pub. Date: Aug. 7, 2014

(65) Prior Publication Data
US 2016/0006397 A1    Jan. 7, 2016

(30) Foreign Application Priority Data
Feb. 1, 2013 (GB) .................................. 1301855.1

(51) Int. Cl.
*H03G 3/20* (2006.01)
*H03F 1/02* (2006.01)
(Continued)

(52) U.S. Cl.
CPC ......... *H03F 1/0222* (2013.01); *H03F 1/0227* (2013.01); *H03F 1/0238* (2013.01);
(Continued)

(58) Field of Classification Search
CPC ... H03F 1/02; H03F 3/217; H03F 3/21; H03F 3/189; H03F 3/24; H03F 1/0222;
(Continued)

(56) References Cited

FOREIGN PATENT DOCUMENTS

GB          2484475 A   *   4/2012   ............. H03F 1/025

OTHER PUBLICATIONS

Wu et al., "A Two-Phase Switching Hybrid Supply Modulator for RF Power Amplifiers With 9% Efficiency Improvement", IEEE Journal of Solid-State Circuits, vol. 45, No. 12, Dec. 2010, pp. 2543-2556.*

* cited by examiner

*Primary Examiner* — Steven J Mottola
*Assistant Examiner* — Hafizur Rahman

(57) ABSTRACT

An envelope tracking power supply arranged to generate a modulated supply voltage in dependence on a reference signal, comprising a first path for tracking low frequency variations in the reference signal and a second path for tracking high frequency variations in the reference signal, and further comprising a combiner having a low frequency combining element for the first path and a high frequency combining element for the second path, and for generating the modulated supply voltage, wherein there is further provided sensing circuitry for sensing a resonance signal in the low or high frequency combining element, and adjusting circuitry for adjusting a signal in the first path in dependence on the sensed resonance signal.

19 Claims, 7 Drawing Sheets

(51) Int. Cl.
*H03F 3/21* (2006.01)
*H03F 3/217* (2006.01)
*H03F 3/189* (2006.01)
*H03F 3/24* (2006.01)
*H03F 3/19* (2006.01)
*H04L 25/49* (2006.01)
*H02M 3/158* (2006.01)
*H02M 1/00* (2006.01)

(52) U.S. Cl.
CPC ............... *H03F 3/189* (2013.01); *H03F 3/19* (2013.01); *H03F 3/211* (2013.01); *H03F 3/217* (2013.01); *H03F 3/245* (2013.01); *H04L 25/4902* (2013.01); *H02M 3/158* (2013.01); *H02M 2001/0045* (2013.01); *H03F 2200/102* (2013.01); *H03F 2200/135* (2013.01); *H03F 2200/375* (2013.01); *H03F 2200/391* (2013.01); *H03F 2200/432* (2013.01); *H03F 2200/451* (2013.01); *H03F 2203/21106* (2013.01); *H03F 2203/21142* (2013.01)

(58) Field of Classification Search
CPC ........ H03F 1/0227; H03F 1/0238; H03F 3/19; H03F 3/211; H03F 3/245; H03F 2200/102; H03F 2200/135; H03F 2200/375; H03F 2200/391; H03F 2200/432; H02M 3/158; H02M 2001/0045; H04L 25/4902
USPC ................ 330/124 R, 124 D, 127, 295–297; 323/243, 274, 275, 281–285, 288, 290
See application file for complete search history.

RESONANCE SUPPRESSION FOR ENVELOPE TRACKING MODULATOR

BACKGROUND TO THE INVENTION

Field of the Invention

The invention relates to envelope tracking modulated power supplies suitable for radio frequency power amplifier applications. The invention is particularly concerned with such power supplies in which a reference signal is used as an input to a low frequency path and a high frequency path, and in which each path generates separate outputs which are combined to form a supply voltage.

Description of the Related Art

Envelope tracking power supplies for radio frequency power amplifiers are well-known in the art. Typically a reference signal is generated based on an envelope of an input signal to be amplified. An envelope tracking power supply generates a supply voltage for the power amplifier which tracks the reference signal.

FIG. 1 shows a prior art envelope tracking (ET) modulator architecture in which a frequency splitter 12 is used to divide an incoming envelope reference signal on line 10 into a high frequency (HF) path signal on line 14 and a low frequency (LF) path signal on line 16. The frequency splitter 12 may include a low pass filter 18 in the low frequency path and a high pass filter 20 in the high frequency path. The signal in the LF path on line 16 is amplified by an efficient switched mode amplifier 22, and the signal in the HF path on line 14 is amplified by a wideband linear amplifier 24. A frequency selective combiner 26 is used to combine the signals in the LF and HF paths after their respective amplification. In FIG. 1 the combiner 26 is illustrated as including a low frequency combining element 28 in the low frequency path, and a high frequency combining element 30 in the high frequency path. A combined signal from the combiner 26 on line 32 provides a feed to a load 34 which for purposes of example is illustrated as a resistor. In a typical application the load is a power amplifier (PA), and the reference signal is derived from an input signal to be amplified by the power amplifier.

An example of a power amplifier system incorporating a supply architecture such as illustrated in FIG. 1 can be found in "Band Separation and Efficiency Optimisation in Linear-Assisted Switching Power Amplifiers", Yousefzadeh et al, [IEEE Power Electronics Specialists Conference 2006]

FIG. 2 shows an alternative prior art arrangement, in which the frequency selective combiner 26 is an inductor-capacitor (LC) combiner. The low frequency combining element is an inductor 28a, and the high frequency combining element is a capacitor 30a. In this arrangement a feedback path 36 takes a signal from the combiner (or modulator) output on line 32, to the input of the linear amplifier 24. The signal on the feedback path 36 is subtracted from the signal in the high frequency path on line 14 by subtractor 38 to provide an input to the linear amplifier 24. The inclusion of the feedback path 36 achieves improved tracking accuracy compared to the arrangement of FIG. 1.

An example of a power amplifier system incorporating a supply architecture such as illustrated in FIG. 2 can be found in "Efficiency Optimisation in Linear-Assisted Switching Power Converters for Envelope Tracking in RF Power Amplifiers", Yousefzadeh et al, [IEEE Symposium on Circuits and Systems 2005].

A problem may arise in prior art arrangements such as illustrated in FIG. 1, for example, in that resonance can occur in the output of the switched mode amplifier and/or the combiner at certain frequencies, which can reduce the efficiency and tracking accuracy of the envelope tracking modulated power supply at those frequencies.

It is an aim of the invention to provide an envelope tracking modulated power supply which offers improvements over the prior art, and in particular which addresses the resonance problem.

SUMMARY OF THE INVENTION

The invention provides an envelope tracking power supply arranged to generate a modulated supply voltage in dependence on a reference signal, comprising a first path for tracking low frequency variations in the reference signal and a second path for tracking high frequency variations in the reference signal, and further comprising a combiner, and for generating the modulated supply voltage, wherein there is further provided sensing circuitry for sensing a resonance signal in the combiner, and adjusting circuitry for adjusting a signal in the first path to control the resonance in dependence on the sensed signal.

The sensing circuitry may be adapted to sense the resonance in the first or second path.

The sensing circuitry may comprise circuitry for sensing a voltage developed across a combining element or a current flowing in a combining element.

The sensing circuitry may be for sensing a voltage developed across a combining element, the circuitry comprising a difference amplifier having two inputs, one input connected at each terminal of the combining element.

The combining element may be a high pass combining element. The combining element may be a capacitor. The combining element may be a low pass combining element. The combining element may be an inductor.

The sensing circuitry may comprises a current sense amplifier in the low pass combining element of the combiner, a differentiator, and a difference amplifier for amplifying the difference between the output of the differentiator and the reference signal, the first signal in the first path being adjusted in dependence on the output of the difference amplifier.

The adjusting circuitry may comprise a combiner for combining the sensed resonance signal with a control signal in the first path to generate an adjusted control signal.

The first path may include a pulse width modulator for controlling switches for generating a switched mode voltage output, wherein the pulse width modulator is varied in dependence upon the adjusted control signal.

The envelope tracking power supply may further comprise a current control feedback loop for sensing a current at the output of the switches, the control signal being generated in dependence on said sensed current.

The envelope tracking power supply may further comprise a difference amplifier for controlling the pulse width modulator, having one input connected to the adjusted control signal and one input connected to the sensed current.

The envelope tracking power supply may further comprise a difference combiner for subtracting the reference signal and the fed back current signal to generate the control signal.

The envelope tracking power supply may further comprise a voltage control feedback loop for sensing a voltage at the output of the switches, the pulse width generator being varied in dependence on the difference between the adjusted control signal and the fed back sensed voltage.

The fed back sensed voltage may be combined with a reference waveform.

The second path may comprise a linear amplifier, having a feedback path connecting the output of the linear amplifier to the input of the linear amplifier, such that the linear amplifier amplifies the difference between the reference signal and the output of the linear amplifier to generate output voltage for combining in the combiner.

There may be provided a feedback path from the output of a linear amplifier in the first path to the input of the linear amplifier and the linear amplifier amplifies a signal comprising the full spectrum of frequencies of the reference signal.

There may be provided an RF amplifier. There may be provided a wireless communication system. There may be provided a wireless mobile device.

The invention may also provide a method in an envelope tracking power supply arranged to generate a modulated supply voltage in dependence on a reference signal, the method comprising providing a first path for tracking low frequency variations in the reference signal and providing a second path for tracking high frequency variations in the reference signal, the envelope tracking power supply further comprising a combiner, and for generating the modulated supply voltage, wherein the method further provides sensing a resonance signal in the combiner, and adjusting a signal in the first path in dependence on the sensed resonance signal.

BRIEF DESCRIPTION OF THE FIGURES

The invention is now described by way of example with reference to the accompanying Figures, in which.

DESCRIPTION OF THE PREFERRED EMBODIMENTS

In the following description the invention is described with reference to exemplary embodiments and implementations. The invention is not limited to the specific details of any arrangements as set out, which are provided for the purposes of understanding the invention.

Embodiments of the invention are described in the following description in the context of application to a preferred advantageous feedback architecture for the linear amplifier in the high frequency correction path. The invention and its embodiments are however not necessarily limited to the particular feedback arrangement in the high frequency correction path.

Figure 3:
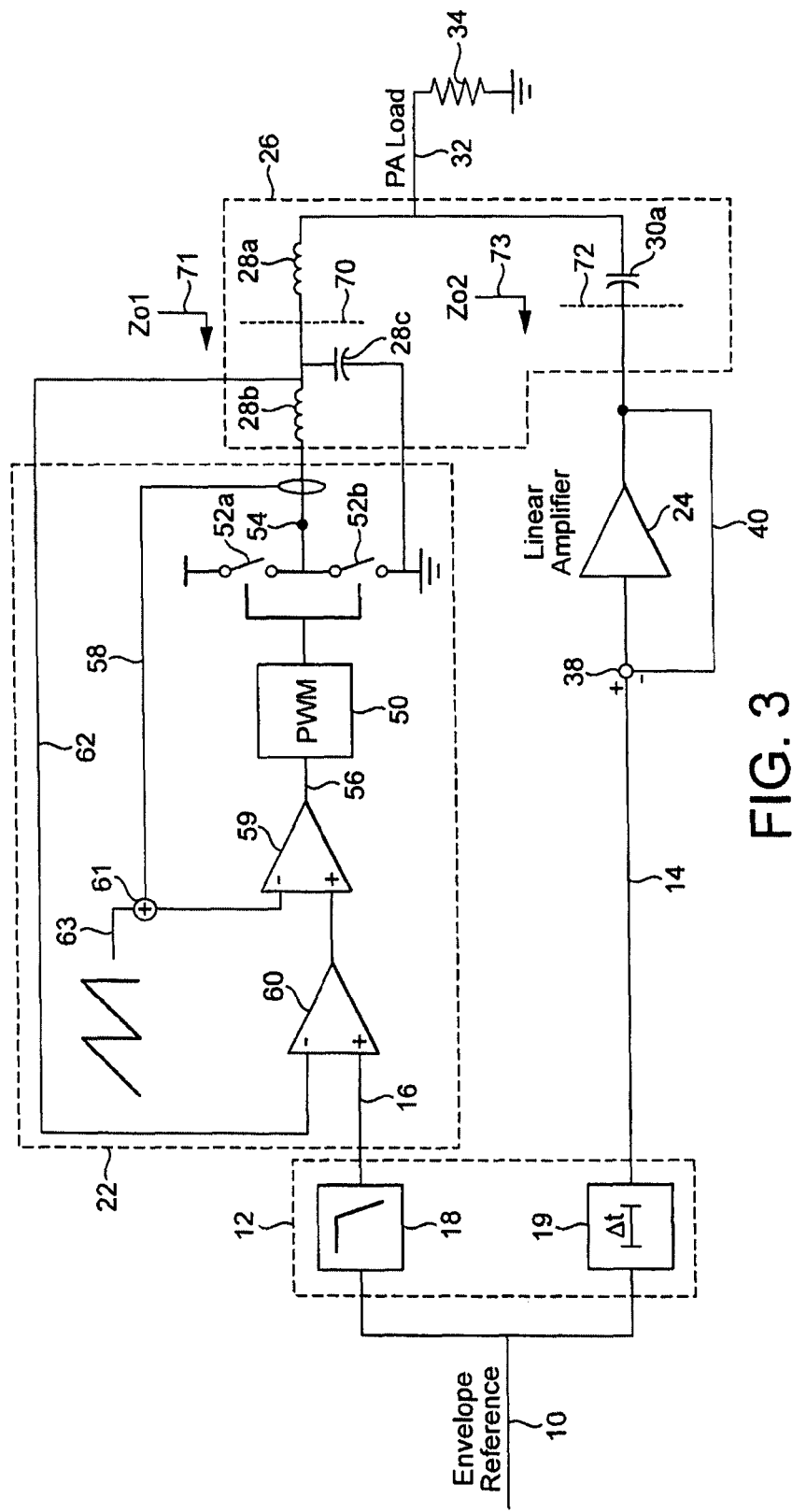
FIG. 3 illustrates an improved envelope tracking modulated supply incorporating details of a preferred switched mode amplifier.

With reference to FIG. 3, there is illustrated an architecture of an advantageous envelope tracking modulator in accordance with a preferred arrangement, in respect of which the problem which the invention addresses is discussed and in respect of which preferred embodiments of the invention are described. FIG. 3 also illustrates a preferred implementation of the switched mode amplifier 22.

Like reference numerals are used in the Figures to identify features in different Figures which are comparable.

Figure 2:
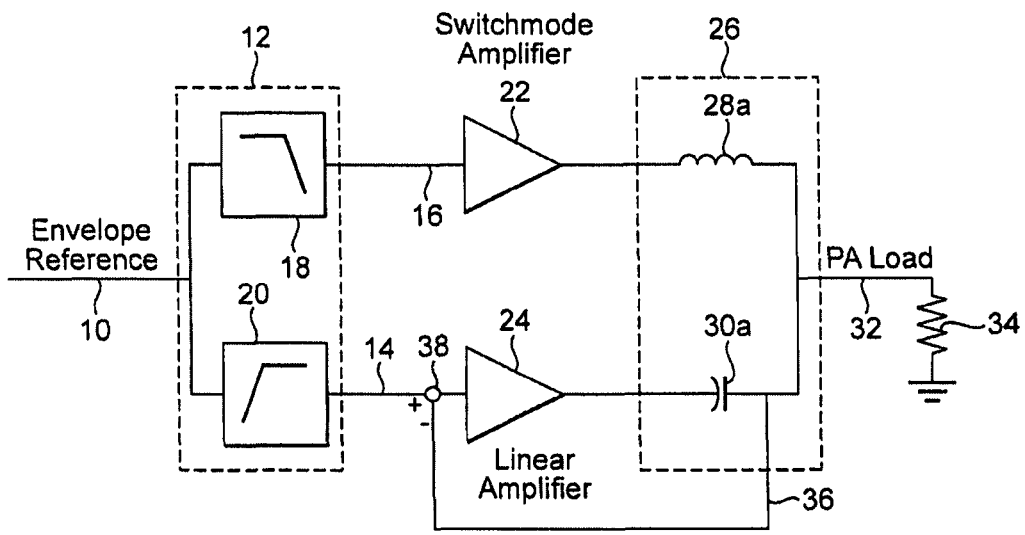
FIG. 2 illustrates a prior art envelope tracking modulated supply incorporating feedback in the high frequency correction path.

It can be noted that the arrangement of FIG. 3 corresponds to the arrangement of FIG. 2, but with the feedback path to the linear amplifier 24 taken from a different point, with the high pass filter 20 removed, and with an optional delay 19 added.

With further reference to FIG. 3, in general the advantageous architecture comprises a low frequency path comprising a switched mode power amplifier for tracking low frequency variations in a reference signal and for generating a switched mode voltage. Also provided is a correction path comprising a linear amplifier for tracking high frequency variations in the reference signal and for generating a correction voltage. The correction voltage is combined with the output of the switched mode amplifier to provide a modulated supply voltage. A feedback path is provided from the output of the linear amplifier (before the combining stage) to the input of the linear amplifier.

Figure 1:
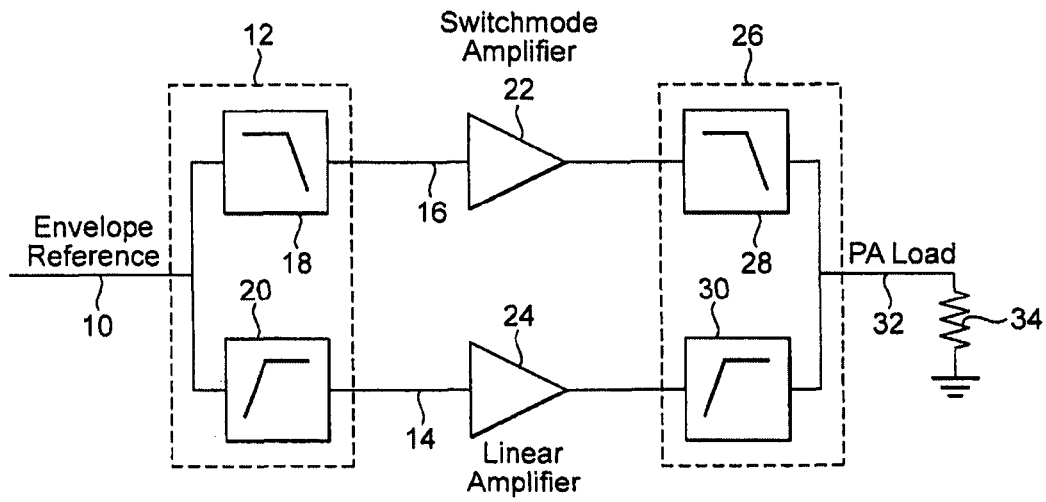
FIG. 1 illustrates a prior art envelope tracking modulated supply including a low frequency path and a high frequency correction path.

In the advantageous arrangement illustrated in FIG. 3, the high pass filter 20 of FIGS. 1 and 2 is preferably eliminated, such that the path comprising the signal on line 14 is no longer a high frequency path, and may therefore be referred to simply as a correction path. The signal on line 14 is the full spectrum of the reference signal on line 10, and may alternatively be referred to as the unfiltered reference signal.

As shown in FIG. 3, a feedback path 40 connects the output of the linear amplifier 24 to an input of the subtractor 38, such that the input to the linear amplifier 24 is the signal on line 14 in the correction path with the signal on the feedback removed. The feedback path 40, taken from the output of the linear amplifier 24, provides a signal which is subtracted from the reference signal to derive the correction signal.

The two signals at the input to the subtractor 38, on paths 14 and 40, comprise full spectrum signals. The signal at the output of the linear amplifier 24 is a full spectrum signal and the efficiency of the supply voltage to the linear amplifier can be maximised. In the arrangements of FIGS. 1 and 2 the output of the linear amplifier is not a full spectrum signal, and the peak-to-peak signal required to be handled by the linear amplifier 24 is larger than the peak-to-peak signal required to be handled in the FIG. 3 arrangement. The feedback arrangement of FIG. 3 where the feedback is taken from the output of the linear amplifier before the combiner is therefore advantageous in improving efficiency.

The arrangement of FIG. 3 additionally preferably includes a modification to address the triangular ripple current which in the arrangement of FIG. 2 flows in the inductor 28a of the combiner 26 as a result of the switching of the switched mode amplifier 22. This triangular ripple current flowing in the inductor 28a in the arrangement of FIG. 2 must be shunted through the output stage of the linear amplifier 24 via capacitor 30a, in order to avoid the creation of unwanted voltage errors at the output of the combiner 26, and hence on the modulator output on line 32. The consequential ripple current flowing through the output of the linear amplifier 24 reduces its efficiency.

FIG. 3 thus additionally shows a preferable arrangement in which the frequency combiner 26 of FIG. 2 is adapted to include an additional capacitor 28c and inductor 28b. The magnitude of the coupling factor between inductors 28a and 28b may range between 0 and 1. The inductor 28b is connected between the output of the switched mode amplifier 22 and the inductor 28a. The capacitor 28c is connected between the common connection of the inductors 28a and 28b and electrical ground.

In this modified arrangement, the ripple current due to the switched mode amplifier 22 now flows in the inductor 28b and is now shunted to ground via the capacitor 28c. The loss associated with the ripple current flowing in inductor 28a and passing through the linear output stage 24 is now avoided.

A further modification in FIG. 3 is to preferably include a delay matching element 19 in the correction path 14. The delay associated with the switched mode amplifier 22 in the low frequency path may then be preferably compensated using the delay matching element 19 in the correction frequency path 14 including the linear amplifier 24.

The LF path switch mode amplifier 22 is preferably implemented, as shown in FIG. 3, as a peak-current-mode buck-converter, which is a known prior art technique for implementing high bandwidth switched mode power supplies.

An advantageous implementation of the switched mode amplifier 22 as illustrated in FIG. 3 is now described.

As illustrated in FIG. 3, the switched mode amplifier 22 includes a pulse width modulator (PWM) 50 which receives a control signal on line 56, and which controls a pair of switches 52a and 52b. Switch 52a is connected between a supply voltage and a common node 54, and switch 52b is connected between the common node and electrical ground. The supply voltage is provided by a battery, and is denoted Vbat. The pulse width modulator 50 controls the switches 52a and 52b to provide the low frequency path output to the combiner 26 in dependence on the control signal on line 56. The arrangement of a pulse width modulator and output switches is known in the art.

The switched mode amplifier 22 includes an inner current control feedback loop and an outer voltage control feedback loop.

The inner current control feedback loop senses the inductor current either directly or indirectly by sensing current in switch 52a or switch 52b, and provides a feedback path 58 to a combiner 61. The combiner 61 combines the feedback signal on feedback path 58 with a compensation ramp signal on line 63. The output of the combiner 61 provides an input to the inverting input of an amplifier 59. The amplifier 59 receives at its non-inverting input an output from an amplifier 60. The amplifier 59 generates the control signal on line 56.

The outer voltage control feedback loop provides a voltage feedback path 62 from the second terminal of the inductor 28b, where it connects to the inductor 28a and capacitor 28c. The feedback path 62 provides a feedback signal to an inverting input of the amplifier 60. The amplifier 60 receives the low frequency path signal on line 16 at its non-inverting input.

Inductor 28b behaves as a current source due to the action of the inner current feedback loop provided by feedback path 58. A compensation ramp is provided on line 63 in this inner current feedback loop, and is used to prevent frequency halving at high duty cycles.

The outer voltage feedback loop provided by feedback path 62 is used to control the voltage at the junction of inductor 28b, inductor 28a, and capacitor 28c.

The peak-current-mode buck-converter as illustrated in FIG. 3 operates, in general, as follows.

The low pass filter 18 generates a signal representing low frequency variation in the reference signal. This signal on line 16 then comprises a control signal for the pulse signal for the buck switcher, comprising switches 52a and 52b, which has a duty cycle determined by the control signal, such that the voltage at the output of the buck switcher tracks the signal on line 16, i.e. the low frequency variation in the reference signal.

In addition, however, this control signal on line 16 is modified by the inner feedback current control loop and the outer feedback voltage control loop.

The outer feedback voltage control loop firstly adjusts the control signal in amplifier 60. The control signal (i.e. the low frequency reference signal) has the feedback signal on feedback path 62 removed therefrom. The feedback voltage on feedback path 62 represent the voltage at the output of the low frequency path, and the removal of this voltage from the low frequency reference signal on line 16 provides a signal representing the error between the output voltage and the reference voltage.

The inner feedback control loop secondly adjusts the control signal in amplifier 59. The second adjusted control signal (output from amplifier 59) has signal on feedback path 58 removed therefrom. The signal on feedback path 58 represents the output current.

There has thus been set out, with reference to FIG. 3, an advantageous architecture within which the invention may be implemented.

The output impedance of the peak-current-mode buck-converter switched mode amplifier 22 of FIG. 3, looking from inductor 28a toward capacitor 28c and inductor 28b, is low across a wide frequency range, and hence the peak-current-mode buck-converter switched mode amplifier 22 may be approximated as a voltage source. This impedance is illustrated in FIG. 3 as the impedance $Z_{o1}$ at a location denoted by dashed line 70, looking in the direction of arrow 71.

The output impedance of the linear amplifier 24 of FIG. 3, looking from capacitor 30a toward the linear amplifier 24 is, due to feedback, similarly low across a wide frequency range of the linear amplifier 24. The linear amplifier may also therefore be approximated as a voltage source. This impedance is illustrated in FIG. 3 as the impedance $Z_{o2}$ at a location denoted by dashed line 72, looking in the direction of arrow 73.

Hence the system of FIG. 3 may be approximated as two voltage sources and an inductor-capacitor combiner, provided by inductor 28a and capacitor 30a, feeding a load 34.

Figure 4:
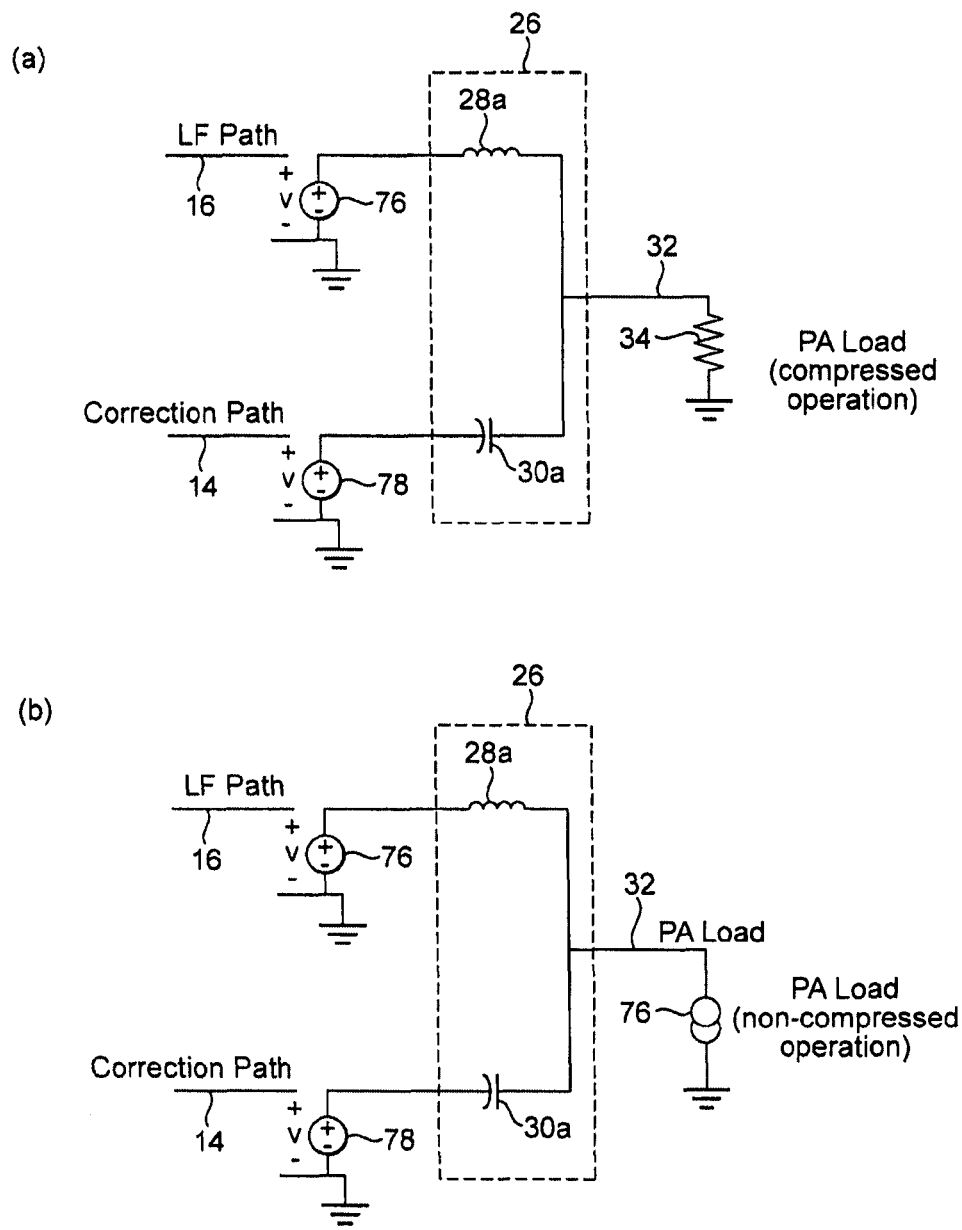
FIGS. 4(a) and 4(b) illustrate approximate circuit models of the envelope tracking modulator of FIG. 3 when the power amplifier load is operated in compression or outside compression.

With reference to FIGS. 4(a) and 4(b), voltage sources approximating the switched mode amplifier 22 and linear amplifier 24 of FIG. 3 are illustrated. The switched mode amplifier 22 is represented by voltage source 76, and the linear amplifier 24 is represented by voltage source 78. The voltage source 76 receives the low path signal on line 16 as a control signal, and generates the switched voltage to the combiner 26. The voltage source 78 receives the correction path signal on line 14 as a control signal, and generates the correction voltage to the combiner 26.

FIG. 4(a) represents operation in compression. As illustrated in FIG. 4(a), when the power amplifier which forms the load is operating in compression it may be approximated as the resistive load 34 of FIG. 3.

FIG. 4(b) represents operation outside of compression. When the power amplifier is operating outside of compression it may be approximated as a current source 76 as shown in FIG. 4(b).

When operating in compression, the inductor 28a and the capacitor 30a together with the power amplifier as represented by resistor 74 form a low Q resonant circuit. When operating outside of compression, the inductor 28a and the capacitor 30a together with the power amplifier as represented by current source 76 form a high Q resonant circuit.

In the case of FIG. 4(b), with operation outside of compression, this resonance of the high Q resonant circuit may cause mis-tracking at the resonant frequency.

Figure 5:
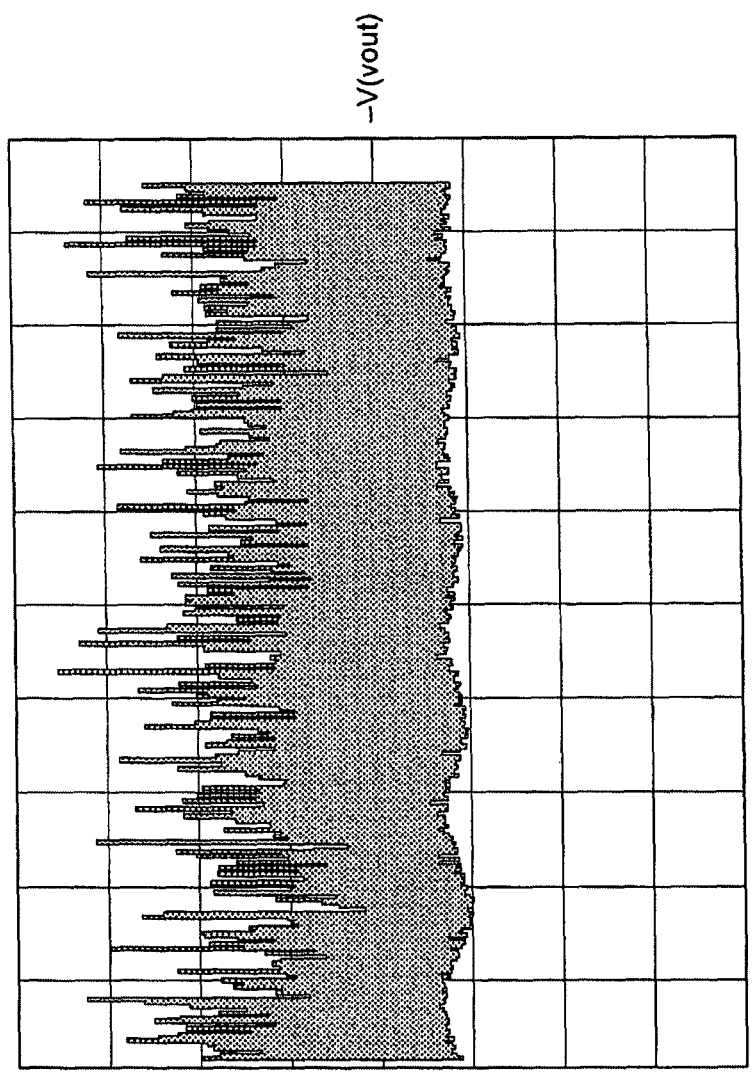
FIG. 5 illustrates the effect of resonance at the output of the switched mode power amplifier based on the model of FIG. 4(b)

The consequence of this mis-tracking at the resonant frequency is illustrated in FIG. 5. As illustrated in FIG. 5, the waveform exhibits unwanted low frequency modulation which is particularly visible in the baseline of the signal. This represents the mis-tracking arising from the resonance. The aim of the present invention is to reduce the mis-tracking by reducing the resonance when operating outside of compression.

Figure 6:
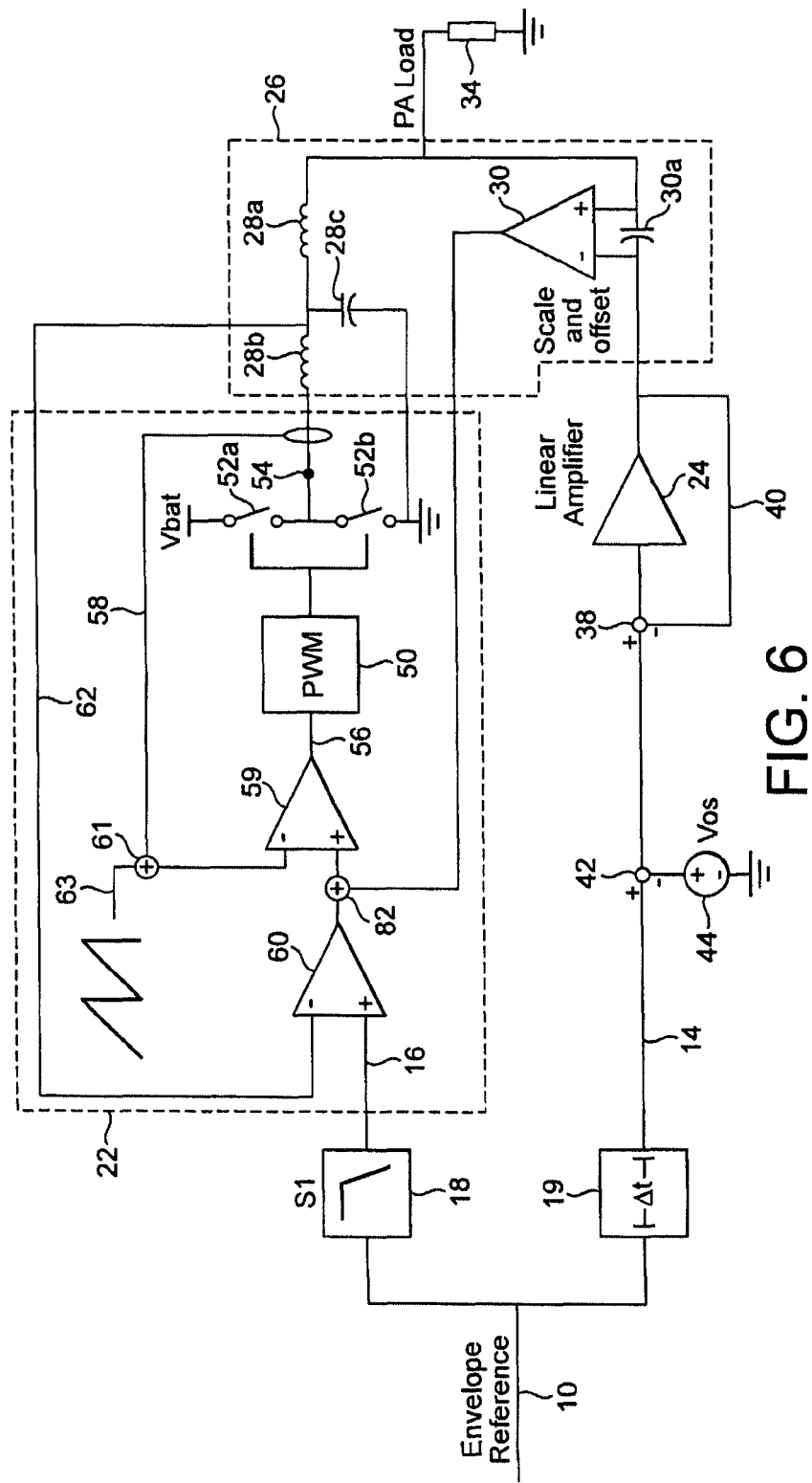
FIG. 6 illustrates an improvement to the arrangement of FIG. 3 in accordance with a first embodiment of the invention.

FIG. 6 shows a modification to the arrangement of FIG. 3 in accordance with an embodiment of the invention, which controls this resonance to address the described problem.

The combiner 26 has a low frequency combining element (the inductor 28a) and a high frequency combining element (the capacitor 30a). As described above with reference to FIGS. 4(a) and 4(b), the resonance occurs between elements of the combiner 26. In order to sense that resonance in the combiner 26, the current in or voltage across an element of the combiner can be sensed. This sensing can be carried out in either half of the combiner 26, i.e. in a high frequency combining element or in a low frequency combining element. Once the resonance is sensed, a feedback path can be used to control the resonance in the path to the combiner.

As illustrated in FIG. 6, in one embodiment a difference amplifier is thus connected across the high frequency combining element (the capacitor 30a), and provides a correction signal for the path which is arranged to track low frequency variations in the reference signal. This represents a preferred implementation.

In this way, the voltage formed across the capacitor 30a is sensed. A scaled and offset replica of this voltage is then combined with the output of the voltage error amplifier 60 of the switched mode amplifier 22 (peak-current-mode buck-converter). The scaling and offsetting is implemented in the amplifier 30.

Thus with reference to FIG. 6, a difference amplifier 30 is provided with inputs connected across the capacitor 30a. The output of the difference amplifier 30 provides an input to a combiner 82, which receives as its other input the output of the voltage error amplifier 60. The combiner 82 combines the output of the difference amplifier 30 with the output of the amplifier 60 to provide the non-inverting input to the amplifier 59.

In an alternative arrangement, this operation may be based on sensing the voltage across, or the current in, the inductor 28a. This is illustrated in FIG. 7.

Figure 7:
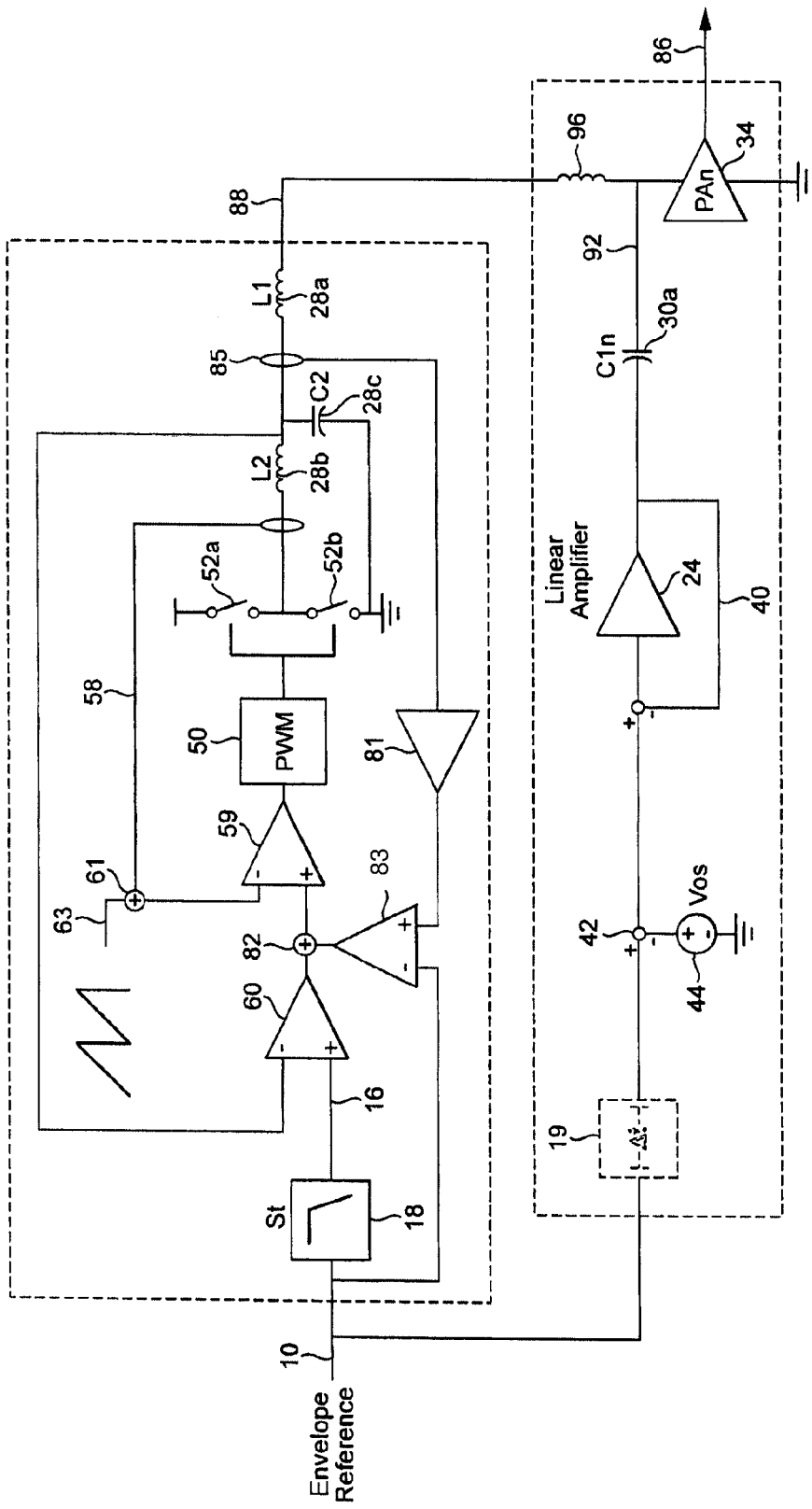
FIG. 7 illustrates an alternative arrangement to FIG. 3 in accordance with a preferred embodiment of the invention.

FIG. 7 illustrates a particularly advantageous arrangement in which resonance control is achieved by sensing the current flowing in the inductor of the low frequency combining element.

As shown in FIG. 7, in accordance with this embodiment, the low frequency path is provided with a differentiating amplifier 81 which operates on the current detected in the output of the low frequency path, as denoted by reference numeral 85, at the input to the inductor 28a.

Further a difference amplifier 83 receives the output of the differentiating amplifier 81, and compares the output of the differentiating amplifier 81 with the voltage at the input to the amplifier 18. The difference amplifier 83 thus provides a feedback signal to the subtractor 82 to remove the resonance generated in the low frequency path in accordance with the above-described techniques.

In different implementations the sensing circuitry may be arranged to sense current or voltage and the embodiments described herein are exemplary.

Thus in general the voltage or current developed across or in an element of the combiner is sensed, being either a low frequency or high frequency combining element.

Figure 8:
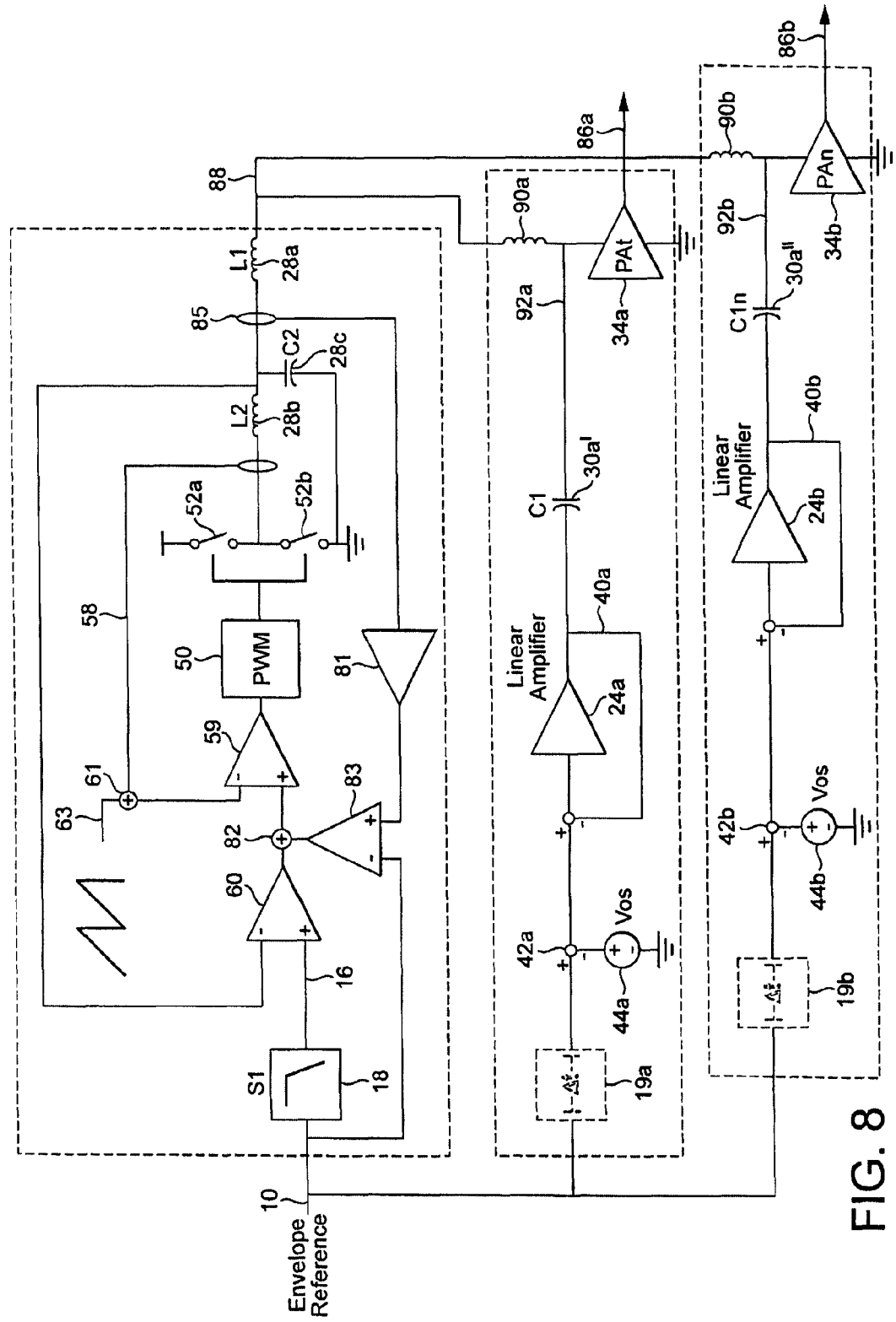
FIG. 8 illustrates the application of the embodiment of FIG. 7 in a distributed architecture in accordance with a preferred embodiment of the invention.

With further reference to FIGS. 6 to 8, an additional but optional modification is shown. To maximise efficiency for example, a DC offset is preferably added to the input signal to the linear amplifier 24 to allow rail-to-rail operation of the linear amplifier 24. A DC offset voltage $V_{OS}$ provided by a voltage source 44 is provided as one input of a subtractor 42, where it is subtracted from the signal on line 14 in the correction path 14. The output of the subtractor 42 provides an offset correction path signal from which the subtractor 38 subtracts the feedback signal on feedback path 40. The value of the DC offset voltage is chosen to position the DC voltage at the output of the subtractor 42 to allow the lowest possible supply voltage to be used for the linear amplifier 24.

The linear amplifier 24 is preferably always operated with the minimum possible supply voltage, which is provided by an efficient switched mode supply (not shown in the arrangements of FIGS. 6 to 8).

The arrangement in which the resonance is reduced by sensing the current or voltage at the output of the low frequency path is particularly advantageous in a distributed architecture where a single low frequency path is provided in conjunction with multiple high frequency paths and multiple correction amplifiers. Such an exemplary embodiment is shown in FIG. 9, and described hereinbelow.

In the arrangement of FIG. 8, a low frequency path comprising the filter 18 and the switched mode power supply 22 is provided as in FIG. 7. The switched mode power supply provides a low frequency voltage on line 88, which provides low frequency correction to each of a plurality of amplifiers 34a, 34b as will be described hereinbelow.

The distributed architecture may provide any number of amplifiers, but for the sake of simplicity two amplifiers 34a and 34b are shown in FIG. 8. The amplifiers 34a, 34b are examples of the load 34 of previous figures.

Each amplifier 34a, 34b receives the low frequency switched supply on line 88 at a first terminal of a respective inductor 90a, 90b, which may optionally be combined with inductor 22a, and combines this with a high frequency correction voltage received at a second terminal of the inductor from a high frequency correction path on line 92a, 92b. The second terminals of the inductors form the supply inputs to the amplifiers 34a, 34b.

In a distributed architecture such as is described, only one power amplifier is active at any one time. The inductance 28a is therefore optional and may not be required as inductors 28a and 90a, 90b are in series.

Each high frequency correction path corresponds to the high frequency correction path of FIG. 7, with each elements shown as distinct by a suffix a or b, except the capacitor 30a which is denoted by the suffix 30a' or 30a''.

Each high frequency correction path receives the reference signal on line 10. Each high frequency correction path also generates a high frequency correction signal for combination with the common low frequency signal, before application to a respective power amplifier as the supply thereof. Such a distributed arrangement is known in the art.

The invention and its embodiments relate to the application of envelope tracking (ET) to radio frequency (RF) power amplifiers, and is applicable to a broad range of implementations including cellular handsets, wireless infrastructure, and military power amplifier applications at high frequencies to microwave frequencies.

The invention has been described herein by way of example with reference to embodiments. The invention is not limited to the described embodiments, nor to specific combinations of features in embodiments. Modifications may be made to the embodiments within the scope of the invention. The scope of the invention is defined by the appended claims.

The invention claimed is:

1. An envelope tracking power supply arranged to generate a modulated supply voltage in dependence on a reference signal, comprising:
   a first path configured to track low frequency variations in the reference signal;
   a second path configured to track high frequency variations in the reference signal;
   a combiner configured to generate the modulated supply voltage based on the tracked low and high frequency variations, wherein the combiner comprises a low pass combining element coupled between an output of the first path and an output node of the combiner and a high pass combining element coupled between an output of the second path and the output node of the combiner, wherein the low pass combining element comprises an inductor and the high pass combining element comprises a capacitor;
   sensing circuitry configured to sense a resonance signal in the combine; and
   adjusting circuitry configured to adjust a signal in the first path to control the resonance in dependence on the sensed signal.

2. The envelope tracking power supply of claim 1, wherein the sensing circuitry is adapted to sense the resonance signal in the first or the second path.

3. The envelope tracking power supply of claim 1, wherein the sensing circuitry is configured to sense a voltage developed across the high pass combining element or a current flowing in the low pass combining element.

4. The envelope tracking power supply of claim 3, wherein the sensing circuitry is configured to sense the voltage developed across the high pass combining element, the sensing circuitry comprising a difference amplifier having two inputs, one input of the difference amplifier connected at each terminal of the high pass combining element.

5. The envelope tracking power supply of claim wherein the sensing circuitry comprises a current sense amplifier in the low pass combining element of the combiner and a difference amplifier configured to amplify a difference between an output of the current sense amplifier and the reference signal, a first signal in the first path being configured for adjustment in dependence on an output of the difference amplifier.

6. The envelope tracking power supply of claim 1, wherein the adjusting circuitry comprises another combiner for combining the sensed resonance signal with a control signal in the first path to generate an adjusted control signal.

7. The envelope tracking power supply of claim 6, wherein the first path includes a pulse width modulator configured to control switches for generating a switched mode voltage output, wherein the pulse width modulator is configured to be varied in dependence upon the adjusted control signal.

8. The envelope tracking power supply of claim 7, further comprising a current control feedback loop configured to sense a current at an output of the switches, wherein the control signal is generated in dependence on the sensed current.

9. The envelope tracking power supply of claim 7, further comprising a difference amplifier configured to control the pulse width modulator, the difference amplifier having one input coupled to the adjusted control signal and one input coupled to the sensed current.

10. The envelope tracking power supply of claim 8, further comprising a voltage error amplifier configured to subtract a current signal, sensed via the current control feedback loop, from the reference signal to generate the control signal.

11. The envelope tracking power supply of claim 7, further comprising a voltage control feedback loop configured to sense a voltage at an output of the switches, wherein the pulse width modulator is configured to be varied in dependence on a difference between the adjusted control signal and a voltage from the voltage control feedback loop.

12. The envelope tracking power supply of claim 11, wherein the voltage from the voltage control feedback loop is combined with the reference signal.

13. The envelope tracking power supply of claim 1, wherein the second path comprises a linear amplifier, having a feedback path connecting an output of the linear amplifier to an input of the linear amplifier, such that the linear amplifier is configured to amplify a difference between the reference signal and the output of the linear amplifier to generate an output voltage for combining in the combiner.

14. The envelope tracking power supply of claim 1, wherein the first path comprises a linear amplifier having a feedback path from an output of the linear amplifier in the first path to an input of the linear amplifier in the first path and wherein the linear amplifier in the first path is configured to amplify a signal comprising a full spectrum of frequencies of the reference signal.

15. An RF amplifier including the envelope tracking power supply of claim 1.

16. A wireless communication system including the envelope tracking power supply of claim 1.

17. A wireless mobile device including the envelope tracking power supply of claim 1.

18. A method in an envelope tracking power supply arranged to generate a modulated supply voltage in dependence on a reference signal, the method comprising:
   tracking low frequency variations in the reference signal in a first path;
   tracking high frequency variations in the reference signal in a second path;
   generating, in a combiner, the modulated supply voltage, based on the tracked low frequency variations and the tracked high frequency variations, wherein the combiner comprises a low pass combining element coupled between an output of the first path and an output node of the combiner and a high pass combining element coupled between an output of the second path and the output node of the combiner, wherein the low pass combining element comprises an inductor and the high pass combining element comprises a capacitor;
   sensing a resonance signal in the combiner; and
   adjusting a signal in the first path in dependence on the sensed resonance signal.

19. The envelope tracking power supply of claim 1, further comprising a difference amplifier, wherein:
   inputs of the difference amplifier are coupled to terminals of the capacitor; and
   an output of the difference amplifier is coupled to a control input for the first path.

* * * * *